United States Patent [19]
Hieber et al.

[11] Patent Number: 4,674,838
[45] Date of Patent: Jun. 23, 1987

[54] CONTACT SCREEN FOR CONTRAST CONTROL

[75] Inventors: Helmut Hieber, Munich; Horst Scharz, Königsdorf, both of Fed. Rep. of Germany

[73] Assignee: Raster-Union Efha Kohinoor GmbH & Co., KG, Fed. Rep. of Germany

[21] Appl. No.: 767,453

[22] Filed: Aug. 20, 1985

[30] Foreign Application Priority Data

Aug. 24, 1984 [DE] Fed. Rep. of Germany ....... 3431250

[51] Int. Cl.⁴ ............................................. G02B 5/00
[52] U.S. Cl. ................................................ 350/322
[58] Field of Search ................... 350/322; 283/91, 93, 283/94, 77, 902, 904, 107, 111, 114

[56] References Cited

U.S. PATENT DOCUMENTS 3,493,381  2/1970  Maurer ............................... 350/322
4,262,070  4/1981  Liu ..................................... 350/322

Primary Examiner—John K. Corbin
Assistant Examiner—Loha Ben
Attorney, Agent, or Firm—Jones, Tullar & Cooper

[57] ABSTRACT

A contact screen for controlling contrast in producing color reproductions by the two-sheet diffusion transfer process yields sharply defined edges and faithful color reproductions without a screen structure if every screen element has a constant measured density from edge to edge that is in the range between 0.90 and 1.40 and if the integral density of the contact screen is between 0.30 and 0.40; the covered surface area occupied by the screen elements amounts to between 40% and 50% of the total surface area of the contact screen. The contact screen can be used for both opaque originals and transparencies.

2 Claims, 7 Drawing Figures

CONTACT SCREEN FOR CONTRAST CONTROL

FIELD OF THE INVENTION

The invention relates to a contact screen for controlling contrast when producing color reproductions by the two-sheet diffusion transfer process. The screen comprises a transparent foil or a film with punctiform or linear screen elements.

BACKGROUND OF THE INVENTION

Various processes for producing color positives on paper or film are know. In the so-called direct color positive process, the color positive is produced as a direct reproduction from a positive original, that is, using only a single sheet of positive material, while in the so-called two-sheet diffusion transfer process, an intermediate negative is needed, which is then placed in contact with a positive transfer material and activated for diffusion in an activator bath. In this process, dictated by the emulsion used, a contact screen of the above type, also known as a contrast control foil, is required in order to lend definition to the negative material.

In the known contact screens, the screen elements, which as a rule are arranged in an elliptical, checkerboard or grid pattern, have a pyramidal course in terms of their density, i.e., the measure of their degree of optical opacity, from edge to edge; in other words, they have their greatest density in the middle or center, and the density then decreases toward the edges of a given screen element and merges more or less continuously with the adjoining transparent element.

Since the color positives (reproductions) produced by the use of such generally neutral-gray contact screens have a reddish tinge in the bright areas, blue-green colored contact screens have already been used as a way to avoid this tinge. However, it is expensive to produce such contact screens with a standardized blue-green coloring. Also, they cannot reliably prevent a tinge in the positive, because the photosensitive material itself cannot be produced in a sufficiently standardized way and hence exhibits fluctuations in the sensitizing of the color layers. While fluctuations in the sensitizing of the negative material can be compensated for when neutral gray contact screens are used, this can be done only with difficulty in the case of colored contact screens.

The essential disadvantage common to both the known, neutral gray or colored, contact screens is that the screen structure is reproduced on the positive. This reproduction of the screen structure is not perceptible to the eye on the reproduced positive, but if this positive is used as an intermediate original for making a screened reproduction for use in printing (original reproduction copy), the superimposing of the contact screen structure that is reproduced on the intermediate original and of the screen used to produce the original reproduction copy leads to a visible moire pattern on the reproduction, which accordingly reappears in the printed copy. A further disadvantage of the known contact screens is that insufficient edge definition is attainable on the positive that is produced; this is very troublesome, particularly when reproducing written materials and fine lines.

SUMMARY OF THE INVENTION

It is therefore an object of the invention to provide a contact screen of the general type discussed at the outset above, which does not perceptibly impair the edge definition of the reproduced positive and which enables the use of the positive as an intermediate original or original reproduction copy in order to produce printed copies which are free of any moire effect.

This object is attained in accordance with the invention in that each screen element has a constant measured density from edge to edge, which when used in combination with opaque originals is in the range between 0.90 and 1.15 and when used in combination with transparencies is in the range between 1.20 and 1.40; the integral density of the contact screen, which is a measure of the degree of optical opacity of the screen, when used in combination with opaque originals is approximately 0.30 to 0.35 and when used in combination with transparencies is approximately 0.35 to 0.40; and the surface area occupied by the screen elements amounts to between 40 to 50% of the total surface area of the contact screen.

Although screens having opaque screen elements with a constant edge-to-edge density have long been known in principle, it has now been discovered, unexpectedly, that contrary to decades-old opinion, which held that a pyramidal course of the density of screen element in contact screens was indispensable (these are so-called shaded-off screens), the use of screen elements with a constant edge-to-edge density in fact avoids the above-described disadvantages of the known contact screens, as long as the above figures for the integral density are adhered to, and as long as a ratio that is appropriate for a given application is adhered to between the density of the screen elements and of the transparent regions between the screen elements, on the one hand, and between the covered surface area occupied by the screen elements and the surface area occupied by the transparent regions, on the other hand. In contrast, the dimensions and size of the screen elements can be selected in the same range as those of the screen elements of known contact screens. The above-indicated ratio between the screen elements and the transparent surface area, together with the measured density of the screen elements, achieves the best results in terms of color reproduction. As a result, contrast filtering, in which even the half tones of the picture elements are preserved, is attainable; this is not the case with the known contact screens, which break up the original into individual picture elements.

The disadvantages of the known, shaded-off screens are presumed to be due to the fact that, given the pyramidal density of each screen element, the core density in its center is so great that it cannot be completely penetrated when exposed to light, and hence the screen structure is copied onto the reproduced original, in which it also causes an off-color tinge.

Contact screens both as found in the prior art and in accordance with the invention are shown in the drawing, along with density diagrams for these screens.

DESCRIPTION OF THE PREFERRED EMBODIMENTS

Figure 1:
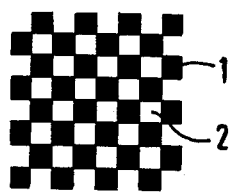
FIG. 1 is a plan view to an enlarged scale of a known contact screen, having screen elements arranged in a checkerboard pattern.
Figure 2:
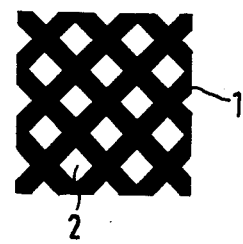
FIG. 2 is an enlarged detail of a known contact screen having screen elements comprising intersecting lines, producing a grid pattern.
Figure 3:
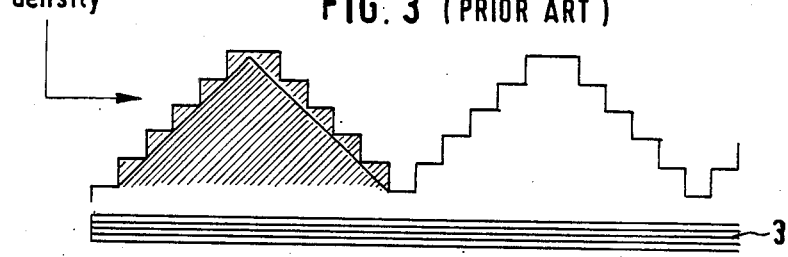
FIG. 3 is a schematic illustration of the profile of the density of two adjacent screen elements of the contact screens shown in FIGS. 1 and 2.
Figure 4A:
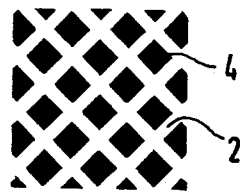
FIGS. 4a, 4b are enlarged illustrations of two contact screens in accordance with the invention.
Figure 4B:
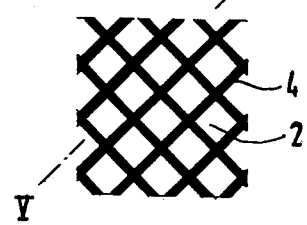
Figure 5:
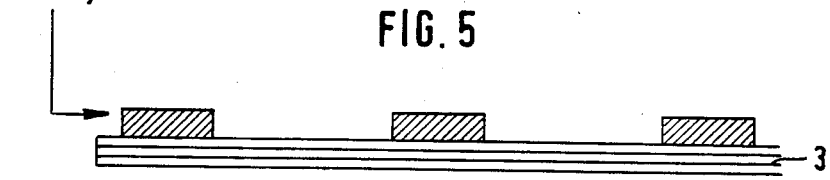
FIG. 5 is a diagram, analogous to FIG. 3, illustrating the profile of the density in the contact screen of FIG. 4b, taken along the line V—V of FIG. 4b.
Figure 6:
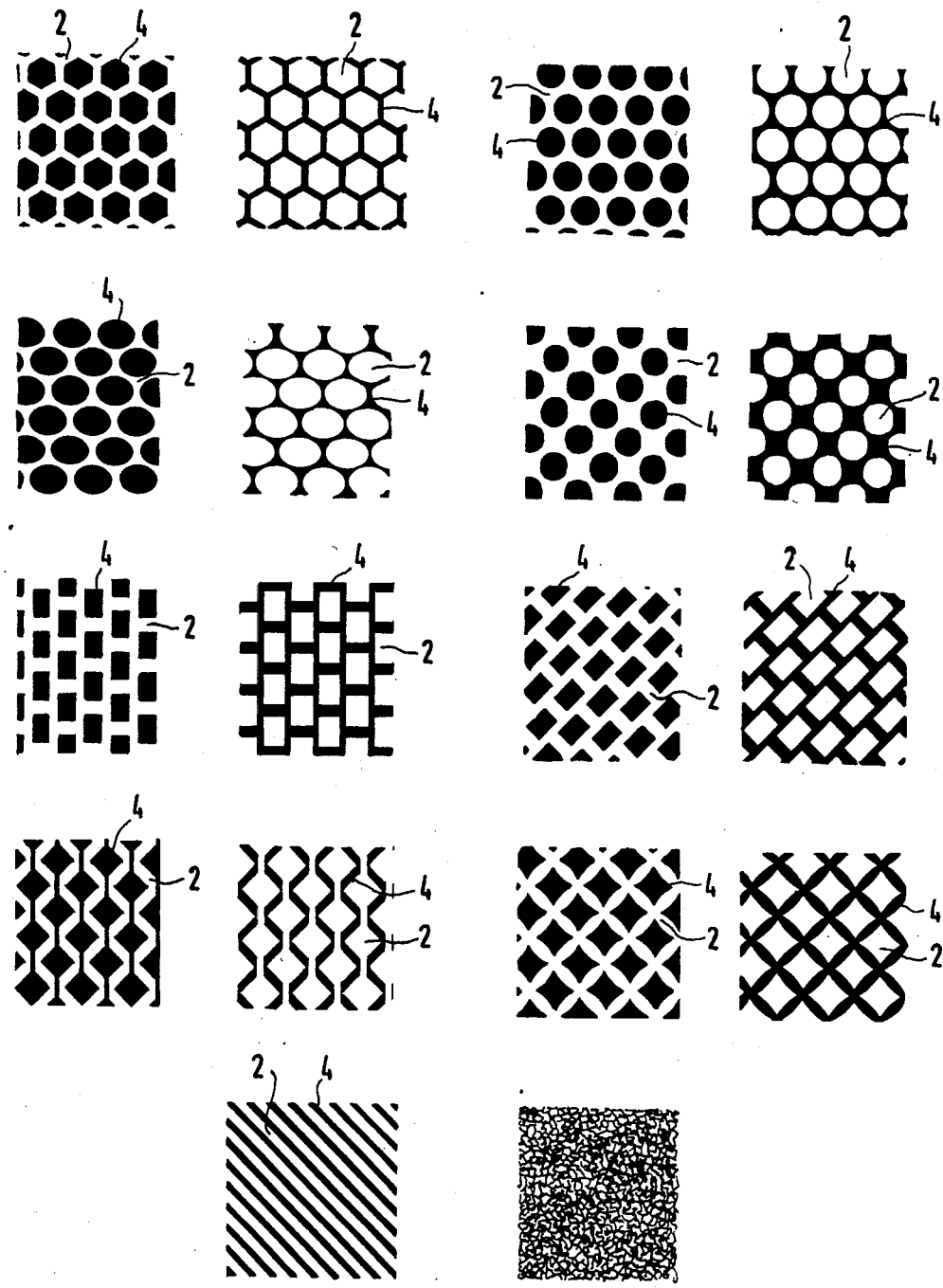
FIG. 6 provides enlarged plan views on possible embodiments of the contact screen according to the invention.

While FIGS. 1, 2, 4a, 4b and 6 need no further explanation, it should be noted in connection with the diagrams of FIGS. 3 and 5 that they provide schematic sections taken through a contact screen in the vicinity of two and three adjacent covered screen elements, respectively, on the base layer (foil or film). Since the covered screen elements in the case of FIG. 3 are shaded off, so that their density has the pyramidal or step-pyramid course shown, the screen elements according to FIG. 5 have a constant density from one edge to the other.

The above-mentioned values of transparencies are measured with a densitometer type DDM 3 manufactured by the West German firm Theimer. Other manufacturers of densitometers use the same scaling wherein for example 0 indicates full opacity, 0.3 means 50%, 1.0 means 90% and 2.0 means 100% transparency.

In the drawing reference numeral 1 indicates a shaded or covered screen element according to the state of the art. 2 indicates a transparent screen element. 3 is the base layer (foil or film). 4 is a shaded or covered screen element in a contact screen according to the invention.

What is claimed:

1. A contact screen for contrast control in producing color reproductions by the two-sheet diffusion transfer process, comprising:

a transparent foil or film having punctiform or linear screen elements, wherein:

each screen element has a constant measured density from edge to edge, which when used in combination with opaque originals is in the range between 0.90 and 1.15, and when used in combination with transparencies is in the range between 1.20 and 1.40;

the integral density of the contact screen when used in combination with opaque originals amounts to approximately 0.30 to 0.35, and when used in combination with transparencies amounts to approximately 0.35 to 0.40; and the covered surface area occupied by the screen elements amounts to between 40% and 50% of the total surface area of the contact screen.

2. The contact screen as defined in claim 1, wherein:
   the covered surface area occupied by the screen elements amounts to between 45% and 47% of the total surface area of the contact screen.

* * * * *